United States Patent [19]

Wada et al.

[11] Patent Number: 5,329,483
[45] Date of Patent: Jul. 12, 1994

[54] MOS SEMICONDUCTOR MEMORY DEVICE

[75] Inventors: Toshio Wada; Shoichi Iwasa, both of Sagamihara, Japan

[73] Assignee: Nippon Steel Corporation, Tokyo, Japan

[21] Appl. No.: 967,709

[22] Filed: Oct. 28, 1992

[30] Foreign Application Priority Data

Oct. 31, 1991 [JP] Japan .................................. 3-313459

[51] Int. Cl.$^5$ .............................................. G11C 5/06
[52] U.S. Cl. ...................................... 365/182; 365/94; 365/104; 365/103; 257/390; 257/391
[58] Field of Search ................. 365/182, 94, 104, 103, 365/51; 257/390, 391

[56] References Cited

U.S. PATENT DOCUMENTS 4,184,207  1/1980  McElroy .............................. 365/182

*Primary Examiner*—Eugene R. LaRoche
*Assistant Examiner*—Huan Hoang
*Attorney, Agent, or Firm*—Pollock, Vande Sande & Priddy

[57] ABSTRACT

A MOS semiconductor memory device comprises a semiconductor substrate of a first conductive type; impurity diffused regions of a second conductive type different from the first conductive type formed into a plurality of spaced columns extending in a first direction on one surface of the semiconductor substrate and having functions of bit lines; a plurality of columns of element isolation insulating films formed on the impurity diffused regions of the second conductive type, with active regions formed therebetween; a plurality of MOS transistors formed in the active regions aligned in each of a plurality of rows extending in a second direction substantially perpendicular to the first direction, each MOS transistor including a gate formed on a part of the active region with a gate insulating film therebetween and source and drain formed in the impurity diffused regions of the second conductive type; and word lines each connected electrically to the gates of the MOS transistors aligned in each of the rows and extending in the second direction; wherein, when it is assumed that the plurality of columns are named as first and second columns alternately, the sources of the MOS transistors in adjacent two columns at both sides of the bit line of the first column are all connected to the bit line of the first column, and the drains of the MOS transistors in adjacent two columns at both sides of the bit line of the second column are all connected to the bit line of the second column.

4 Claims, 6 Drawing Sheets

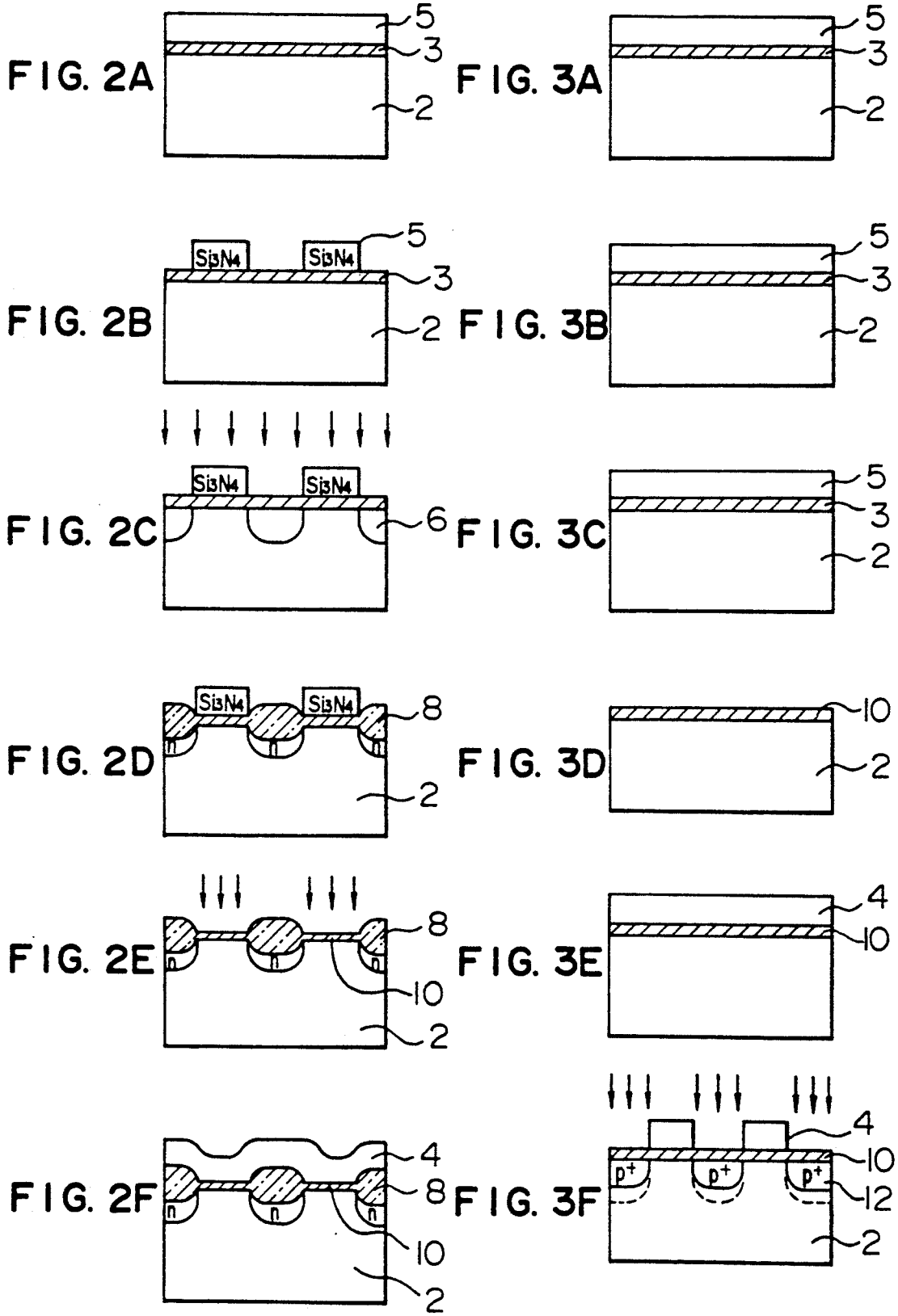

MOS SEMICONDUCTOR MEMORY DEVICE

CROSS-REFERENCE TO THE RELATED APPLICATION

This application is relating to co-pending U.S. patent application Ser. No. corresponding to Japanese Patent Application No. 3-313,461 filed on Oct. 31, 1991.

BACKGROUND OF THE INVENTION

1. Field of the Invention

The present invention relates to a MOS semiconductor memory device, and more particularly to a structure of a MOS semiconductor memory device used as a mask MOS for writing a program during a manufacturing process.

2. Description of the Related Art

A diffused layer program system, an ion implantation program system, a contact hole program system and the like are used for writing a program in a mask ROM. These systems are described in "Design of CMOS Super Large Scale LSIs" supervised by Takuo Sugano, published on Apr. 25, 1989 by Baifukan, pp. 168–169. As to a cell area per bit, a mask ROM by the ion implantation program system has the smallest area, and a series type arrangement can be adopted therein.

FIG. 7 shows a schematic partial plan view of a conventional series type mask ROM by the ion implantation program system, and FIG. 8 shows an equivalent circuit diagram of that mask ROM. Source and drain diffused layers of MOS transistor 72 serve as a bit line 54, and each word line 52 is formed in a direction perpendicular to the bit line 54. Thus, an arrangement where the channel direction of the MOS transistor 72 forming a respective memory cell coincides with the direction of the bit line 54 is obtained. Programming is performed normally in such a manner that the threshold voltage (hereinafter abbreviated as Vth) of each of MOS transistor 72 is set in an enhancement type in advance, and only the Vth of the selected MOS transistors 72 is changed over to a depletion type by an ion implantation method for programming. In FIG. 7, 82 represents an isolation insulator, and, in FIG. 8, 62 represents a row decoder and 64 represents a column decoder.

In order to read data out of a memory cell, all the word lines are initially made at a high level and then the selected word line 52 is brought to a low level and the selected bit line 54 is brought to a high level. At this time, when the Vth of the selected memory cell is of a depletion type, an electric current flowing in the selected bit line 54 is kept flowing even if the word line 52 is brought to the low level. On the other hand, if the Vth is of an enhancement type, the electric current flowing through the selective bit line 54 is cut off. The data is read out by the method described above.

Further, FIG. 9 shows a circuit diagram of a conventional parallel type mask ROM. The circuit is structured so that a bit line 56, a MOS transistor 72 and a bit line 58 are arranged in this order repeatedly in the row direction. A drain and a source of each of the MOS transistors 72 arranged in the column direction are connected to left and right bit lines 56 and 58, and gates of the MOS transistors arranged in the row direction are connected to the same word line 52. The bit lines 56 are all grounded electrically, and selection of one of the columns is made by means of the bit lines 58.

In the case of the parallel type structure, the Vth of each MOS transistor 72 is set to an enhancement type to such an extent that the MOS transistor is turned on when the gate (word line 52) of the MOS transistor 72 is brought to a high level at time of data readout. The programming is performed by changing only the Vth of the selected memory cell by the ion implantation method to such a value that the MOS transistors 72 is not turned ON even if the word line is brought to a high level. In order to read data out of the memory cell all the word lines 52 are initially kept at a low level or opened and the bit line 58 are also kept opened. Then, only the selected word line 52 is brought to a high level, and selection of one of the columns is made by means of the bit lines 58. The memory cell is selected in such a manner for reading the data thereof through a sensor 66.

The series type mask ROM is widely used in general, since the cell size can be made smallest. Since respective MOS transistors 72 arranged in the column direction are connected in series directly to the bit line 54, however, there is the problem that the source of the MOS transistor 72 is not directly coupled with the substrate potential and hence the Vth of the transistor rises by the body effect. Moreover, as the number of the MOS transistors 72 connected in series in the column direction is increased, the total channel conductance thereof gets smaller. Therefore, there is also the problem that the reading current is restricted, and the reading speed becomes slower.

On the other hand, in the parallel type mask ROM, the sources of respective MOS transistors 72 are always grounded through the bit lines 56, and no influence by the body effect is exerted. In addition, even if the number of the MOS transistors 72 connected in the column direction is increased, the reading current flowing through to the bit line 58 is not restricted. Thus, it is possible to solve the problems of the series type mask ROM. Since two bit lines 56 and 58 are required for each memory cell, however, the memory cell size becomes larger, thereby making it difficult to integrate the memory cells at high density. A conventional parallel type mask ROM is disclosed in JP-A-63-127,496 for instance.

SUMMARY OF THE INVENTION

It is an object of the present invention to provide a parallel type MOS semiconductor memory device which can be integrated at a high density, thus making it possible to manufacture the same in a small size.

In order to achieve the above-mentioned object, a MOS semiconductor memory device of the present invention comprises a semiconductor substrate of a first conductive type. Impure diffused regions of a second conductive type different from the first conductive type are formed into a plurality of columns spaced in a first direction on one surface of the semiconductor substrate and function as bit lines. Isolation insulators formed in a plurality of columns on the impurity diffused regions of the second conductive type with active regions formed therebetween. A plurality of MOS transistors are formed in the active regions aligned in each of a plurality of rows extending in a second direction substantially perpendicular to the first direction. Each MOS transistor includes a gate formed on a part of the active region with a gate insulating film interposed therebetween and source and drain are formed in the impurity diffused region of the second conductive type. Word lines are connected electrically to the gates of the MOS transistors aligned in the respective rows and extend in the second direction. When it is assumed that the plurality of columns are named as first and second columns alternately, the sources of the MOS transistors in adjacent two columns at both sides of the bit line of the first column are all connected to the bit line of the first column, and the drains of the MOS transistors in adjacent two columns at both sides of the bit line of the second column are all connected to the bit line of the second column.

A MOS semiconductor memory device of the present invention is a parallel type memory device structure as described above in which a plurality of memory cells are arranged in a matrix of rows and columns, each memory cell being formed of one MOS transistor. The sources of the MOS transistors are arranged in adjacent two columns at both sides of the bit line of the first column and are all connected to the bit line of the first column. The drains of the MOS transistors arranged in the adjacent two columns at both sides of the bit line of the second column are all connected to the bit line of the second column. Thus, the number of bit lines is reduced to about half as compared with a conventional parallel type semiconductor memory device, i.e., the number of the bit lines is increased only by one as compared with a conventional series type semiconductor memory device, thus making it possible to integrate memory cells at a high density. Furthermore, all the source diffused layers of the MOS transistors aligned in one column are connected to one bit line, and the ground potential may be obtained selectively. Hence, no influence by the body effect is exerted.

BRIEF DESCRIPTION OF THE DRAWINGS

FIGS. 2A to 2F and 3A to 3F are views showing the respective steps of a method of manufacturing a MOS semiconductor memory device according to one embodiment of the present invention;

DESCRIPTION OF THE PREFERRED EMBODIMENTS

Figure 1A:
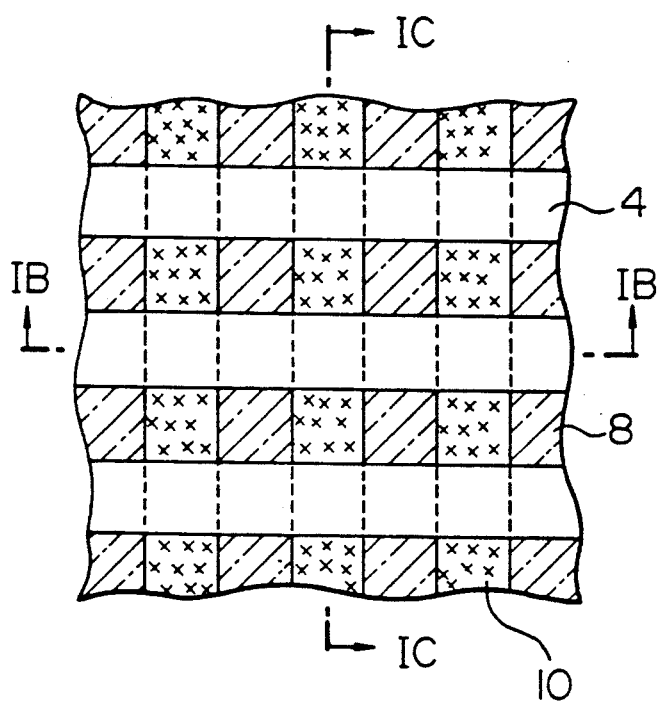
FIGS. 1A, 1B and 1C show a schematic plan view of a MOS semiconductor memory device according to one embodiment of the present invention and sectional views thereof taken along lines IB—IB and IC—IC shown in FIG. 1A.

The configuration of a MOS semiconductor memory device used as a mask ROM according to an embodiment of the present invention will be described with reference to FIGS. 1A, 1B and 1C.

In a memory cell array of a mask ROM according to the present embodiment, word lines 4 formed of polycrystalline silicon layers 4 or polycide layers are formed at equal spaces in a IB—IB direction and N-type buried diffused layers 6 are arranged at equal spaces in a IC—IC direction, both on a P-type semiconductor substrate 2. The N-type buried diffused layers 6 are insulated from the word lines 4 through element isolation insulators 8. As a result, a channel length of a cell transistor providing each bit is determined by the space between adjacent N-type buried diffused layers 6, and a channel direction takes the word line direction or the IB—IB direction. Further, in order to prevent parasitic channel from generating between adjacent word lines 4, P-type diffused layers 12 having a higher concentration than the concentration of the P-type semiconductor substrate 2 are formed as shown in FIG. 1C. Besides, in FIG. 1, 10 represents gate insulating films.

Figure 4:
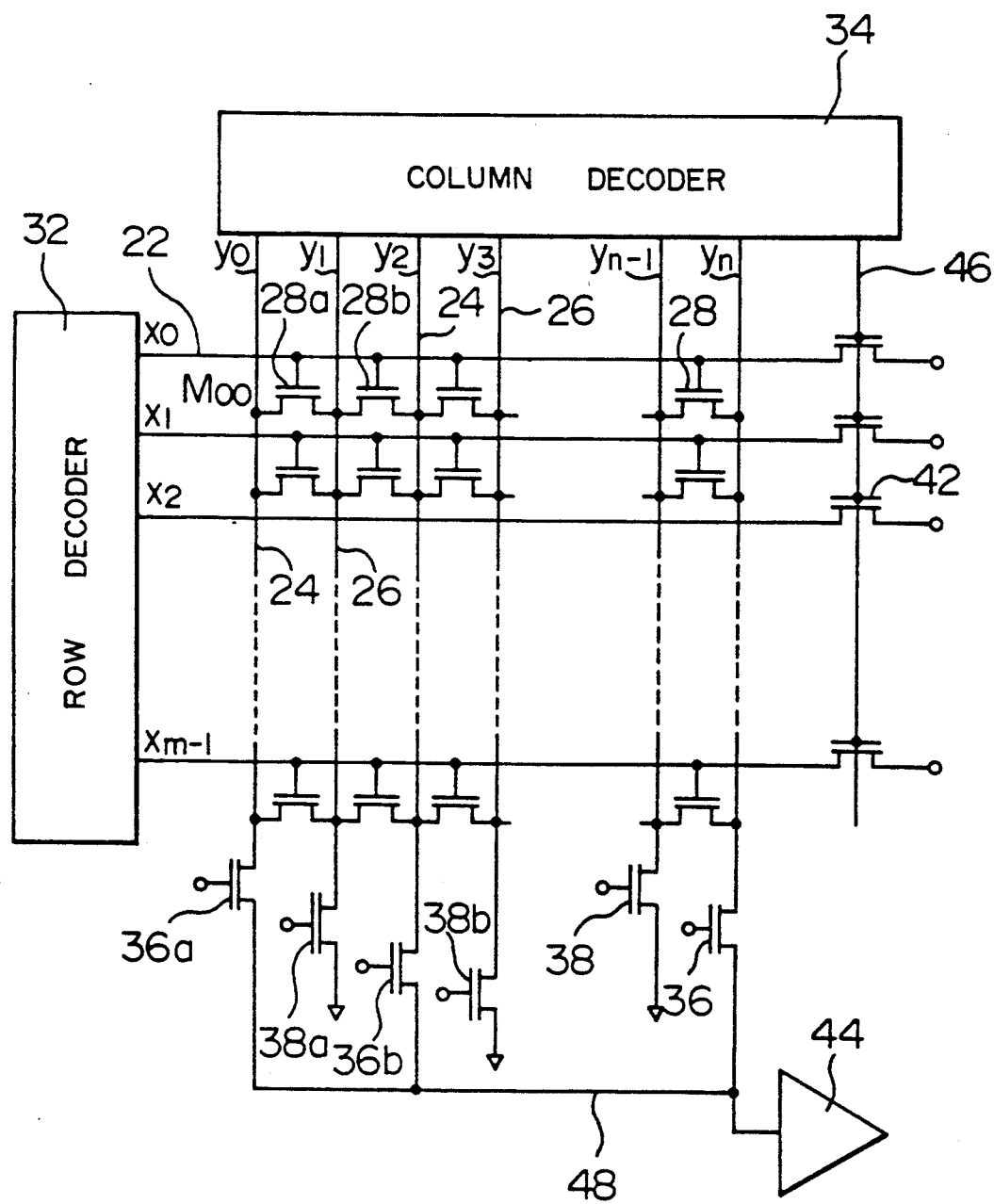
FIG. 4 is a diagram showing a circuit of the MOS semiconductor memory device shown in FIG. 1A.

An equivalent circuit diagram of a mask ROM having the above memory cell array structure is shown in FIG. 4. The circuit shown in FIG. 4 is provided with a plurality of word lines ($x_0$, $x_1$, $x_2$, ..., $x_{m-1}$) 22, first bit lines ($y_0$, $y_2$, $y_4$, ...) 24 and second bit lines ($y_1$, $y_3$, $y_5$, ...) 26 arranged alternately, cell transistors 28 arranged in a matrix of m rows and n columns, a row decoder 32 and a column decoder 34 for selecting a memory cell, first selective transistors 36 and second selective transistors 38, inhibit transistors 42 and a sense amplifier 44.

The memory cell array is constructed by connecting respective drains of every adjacent memory cells arranged along the row direction to the first bit lines ($y_0$, $y_2$, $y_4$, ...) 24 and respective sources thereof to the second bit lines ($y_1$, $y_3$, $y_5$, ...) 26. In practice, the drain diffused layers of respective cell transistors 28 are used as the first bit lines 24 and the source diffused layers as the second bit lines 26. The first bit lines 24 are connected selectively to the input of the sense amplifier 44 through the first selective transistors 36, and the second bit lines 26 are grounded selectively through the second selective transistors 38. Further, the column decoder 34 makes high level selectively the first and the second bit lines 24 and 26 connected to a selected memory cell to be read out and makes low level a line 46 connected to gates of the inhibit transistors 42, and the row decoder 32 energizes selectively the word line 22 connected to the selected memory cell. Incidentally, the inhibit transistors 42 are used to bring the potential of the word lines at time of non-selection of all memory cells to a low level.

The threshold voltage (hereinafter abbreviated as Vth) of each cell transistors 28 is set in advance in an enhancement type of such an extent that the cell transistor is turned on when the word line 22 of each cell transistor 28 is brought to a high level. Then, programming is performed by changing only the Vth of each of the selected memory cells to a value that the cell transistor is not turned on even if the word line is brought to a high level.

Next, a method of reading the data in the mask ROM of the first embodiment will be described. For example, the case of reading a memory cell $M_{00}$ in FIG. 4 will be explained. First, the inhibit transistors 42 are brought into an OFF state. The first and the second bit lines $y_0$ and $y_1$ are selected by the column decoder 34 so as to render a first selective transistor 36a and a second selective transistor 38a conductive. By this, the bit line $y_1$ is grounded. Then, the word line $x_0$ is selected, and a high level potential Vcc is applied to gates of cell transistors 28 connected to the word line $x_0$. If the Vth of the cell transistor 28a is lower than Vcc, i.e. Vth<Vcc the cell transistor 28a becomes conductive, and an electric current flows between the first bit line y₀ and the second bit line y₁. On the other hand, if the Vth of the cell transistor 28a is higher than Vcc i.e. Vth>Vcc, the cell transistor 28a becomes non-conductive. Therefore, no electric current flows between the bit lines. The programmed state of the cell transistor 28 is detected by testing the impedance of the selected cell transistor 28 in this manner.

In the next place, a method for manufacturing a MOS semiconductor memory device shown in FIG. 1A will be described with reference to FIGS. 2A-2F and 3A-3F.

Figure 1C:
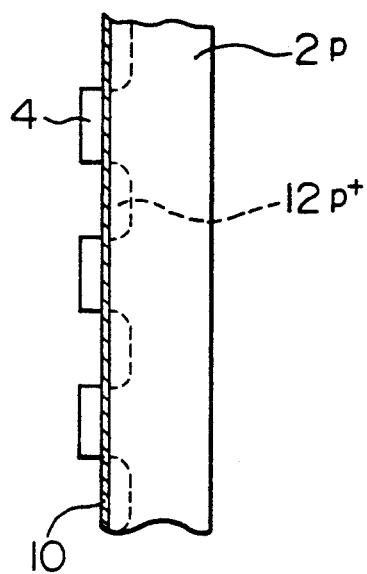
Figure 1B:
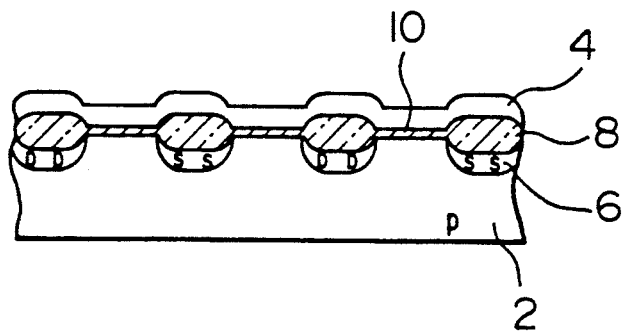

FIGS. 2A to 2F show partial cross-sections of intermediate products of the memory device of FIG. 1A in respective steps of the method of manufacturing the same along the row direction, i.e. IB—IB. FIGS. 3A to 3F show partial cross-sections of the intermediate products along the column row direction, i.e. IC—IC.

As shown in FIGS. 2A and 3A, after forming a silicon oxide film 3 having a thickness of 40 to 60 nm on the P-type semiconductor substrate 2 by a thermal oxidation method, a silicon nitride film is further formed with a thickness of 150 nm by a lower pressure CVD (LPCVD) method thereon. Then, as shown in FIGS. 2B and 3B, the silicon nitride film is etched selectively by photolithography techniques and anisotropic dry etching (RIE) so as to leave spaced stripes of the silicon nitride films 5 only at portions where a plurality of active regions extending in the column direction are to be formed. Next, as shown in FIG. 2C, N-type impurities such as are ion-implanted at an acceleration voltage such that the ions do not penetrate a film thickness of 190 to 210 nm corresponding to a sum of the thickness of the silicon nitride film and the thickness of the silicon oxide film, thereby to form n-type diffused regions 6 which are used as source and drain regions of the MOS transistors and bit lines connected thereto. The diffused regions 6 do not appear in FIG. 3C which shows a cross-sections along the stripe of the silicon nitride film.

Then, as shown in FIG. 2D, element isolation insulating films 8 are formed on the above-mentioned diffused regions 6 by a local oxidation of silicon (LOCOS) method. Therefore, as shown in FIGS. 2E and 3D, the silicon nitride film and silicon oxide film are removed, and a gate insulating film 10 having a thickness of 20 to 30 nm is formed in the active regions by a thermal oxidation method. Next, in order to adjust the threshold voltage of each MOS transistor in accordance with the data to be programmed in the ROM, ion implantation is performed selectively at the portions of the active regions where channel regions of the MOS transistors are formed as shown in FIG. 2E. With this, a mask ROM as shown in FIG. 1A is obtained.

Then, as shown in FIGS. 2F, 3E and 3F, a polycrystalline silicon film 4 is deposited at a thickness of 300 to 400 nm by the LPCVD method and etched selectively thereafter so as to leave stripes of the film 4 only at the channel regions in the row direction, thereby to form gate electrodes and the word lines 4 connected thereto. Furthermore, P-type impurities such as boron are introduced into the semiconductor substrate by on implantation at an acceleration voltage of such a value the ions do not penetrate the gate electrodes, thereby to form P-type diffused layers 12 on the portions which are not covered by the gate electrodes on the active regions as shown in FIG. 3F.

Since the mask ROM in the first embodiment is formed a parallel type structure, the cell transistor is not subject to the influence of the substrate bias effect, so that it operates at the Vth determined by the ion implantation method, and moreover, it is possible to connect more transistors in the column direction. Further, because of the fact that adjacent two cell transistors in the row direction are structured so as to be connected to the same bit line located therebetween, the number of the bit lines is reduced to approximately a half of that of a conventional parallel type mask ROM, i.e., it is increased only by one as compared with a conventional series type bit lines. Moreover, only the channel direction of the cell transistor is changed to the direction of the word line and the diffused layers for bit lines are formed in the element isolation regions as compared with a conventional series type memory. Therefore, it is possible to realize the parallel type mask ROM catch almost the same cell size as that of a conventional series type mask ROM.

Figure 5A:
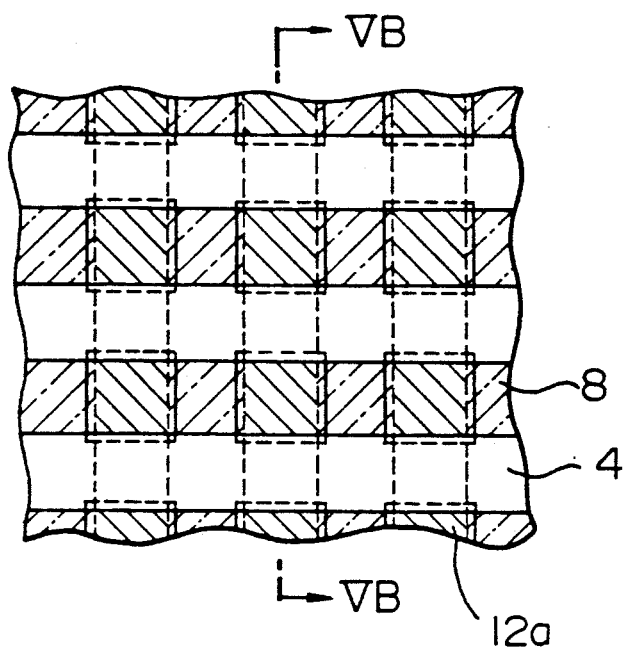
FIGS. 5A and 5B show a schematic plan view of a MOS semiconductor memory device according to another embodiment of the present invention and a sectional view taken along VB—VB.
Figure 5B:
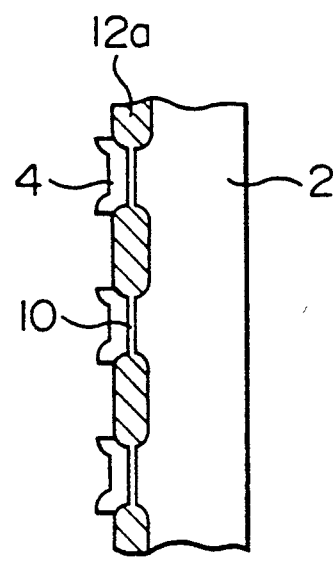

Next, a second embodiment of the present invention is shown in FIGS. 5A and 5B. FIG. 5A is a schematic partial plan view of a memory cell array of a mask ROM according to the second embodiment of the present invention, and FIG. 5B is a sectional view taken along a line VB—VB in FIG. 5A. In FIGS. 5A and 5B, the same or similar components as those of the first embodiment, are designated by the same reference numerals and detailed description thereof is omitted.

The second embodiment is different from the first embodiment in that the means for preventing generation of a parasitic channel between word lines 4 is changed. In the first embodiment, the P-type diffused layer 12 having the same conductivity type as the substrate is used as the parasitic channel preventing means, but the access speed is reduced by this arrangement since the junction capacitance with source/drain diffused layers is increased. In the second embodiment, it is possible to prevent the decreasing of the access speed, as well as the generation of parasitic channel by providing the element isolation insulating films 12a on the element isolation regions. The other effects are similar to those of the first embodiment.

Figure 6:
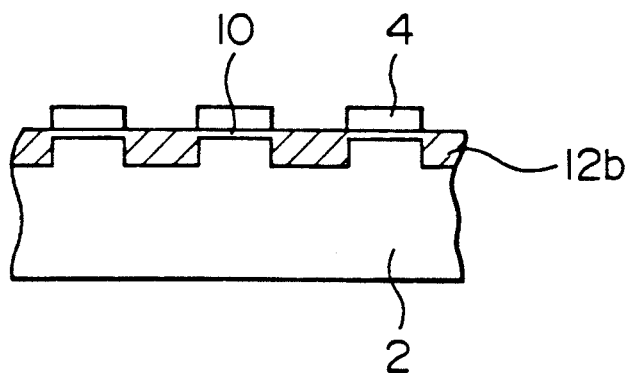
FIG. 6 is a sectional view corresponding to FIG. 5B of a MOS semiconductor memory device according to still another embodiment of the present invention.
Figure 7:
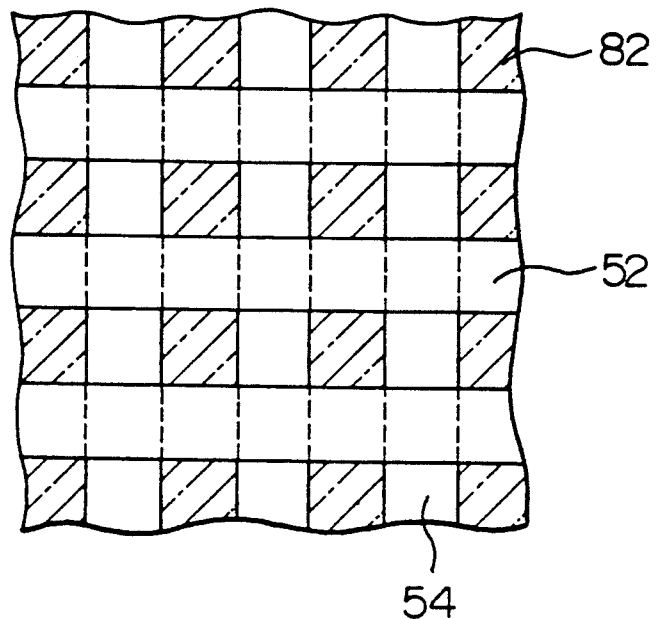
FIG. 7 is a schematic partial plan view of a conventional series type mask ROM according to an ion implantation system.
Figure 8:
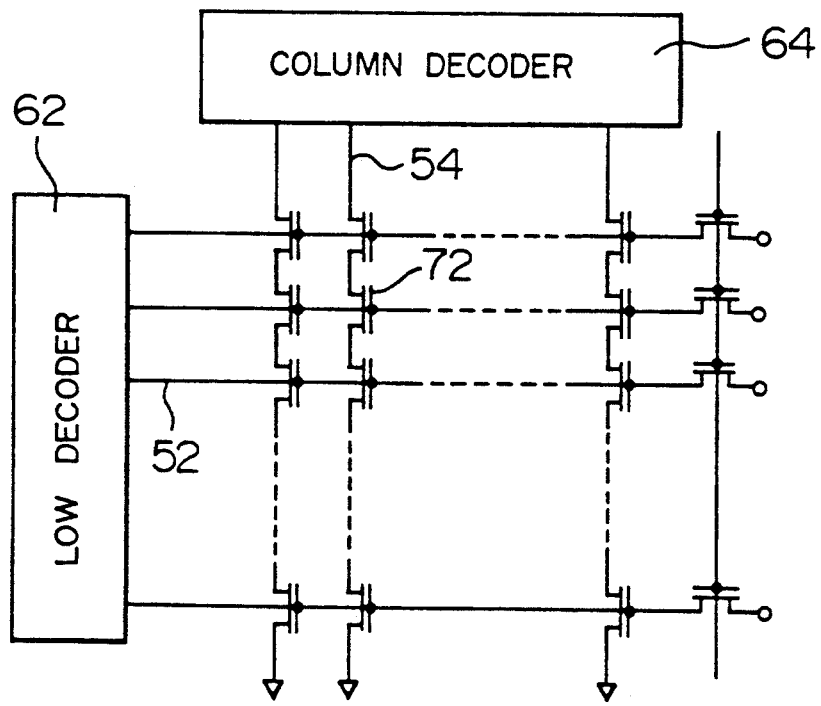
FIG. 8 is a circuit diagram of the mask ROM shown in FIG. 7.
Figure 9:
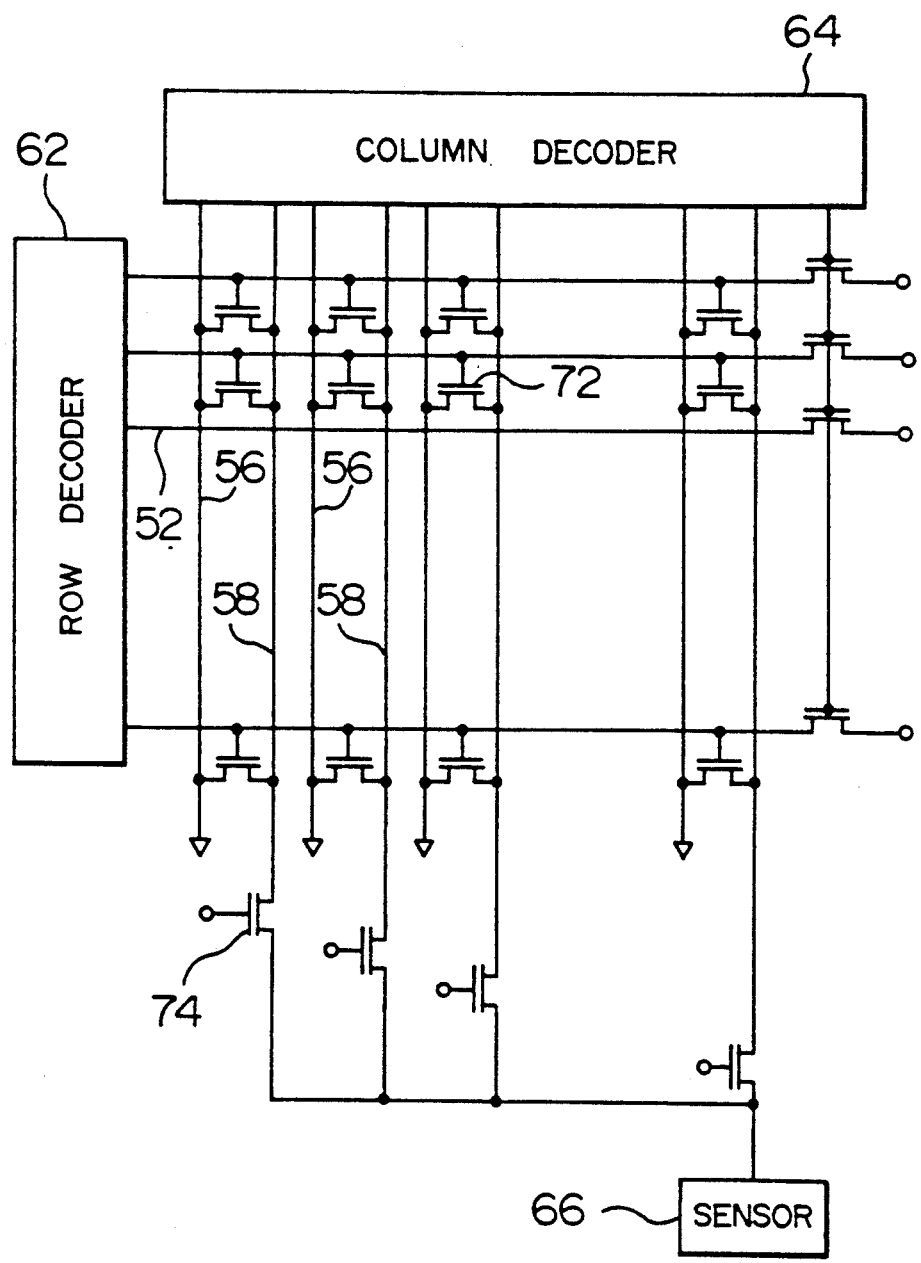
FIG. 9 is a circuit diagram of a conventional parallel type mask ROM.

Next, a third embodiment of the present invention is shown in FIG. 6. FIG. 6 shows a schematic sectional view of a memory cell array of a mask ROM according to the third embodiment of the present invention corresponding to FIG. 5B in the second embodiment.

The third embodiment is different from the second embodiment in that it has a construction having element isolation insulating film 12b obtained by forming trenches in element isolation regions and a dielectric material is buried therein, and the positional relationship between the element isolation insulating films 12b and the word lines 4 and that between the element isolation insulating 12b and the bit lines are in a self-alignment relationship. The other effects are similar to those in the first embodiment.

Incidentally, in the above-mentioned respective embodiments, the initial threshold voltage of the memory cell is set to less than a high level potential in advance, and programming is performed by changing only the Vth of selected cell transistors to a value higher than Vcc by the ion implantation method. However, the programming is not limited to this system, but another system such as diffused layer program system may be adopted.

As described above, according to the present invention, it is possible to increase the number of the MOS transistors which can be connected in one column line as compared with a conventional series type mask ROM because the mask ROM of the invention has the parallel type structure so that the influence of substrate bias effect is removed. Further, it is also possible to reduce the number of column lines by half as compared with a conventional parallel type mask ROM, i.e., the number is increased only by one as compared with that of the column lines of a conventional series type mask ROM, and to form the size of the MOS transistor in approximately the same size as that of a conventional series type mask ROM by constructing so that adjacent two MOS transistors arranged in the row direction are connected to the same first column line or second column line located therebetween, thus making it possible to provide a semiconductor memory device with almost the same cell size as that of a conventional series type mask ROM and with the memory cells integrated at high density.

We claim:

1. A MOS semiconductor memory device comprising:

a semiconductor substrate of a first conductive type;

first impurity diffused regions of a second conductive type different from the first conductive type extending parallel in a first direction on one surface of said semiconductor substrate which function as bit lines;

a plurality of spaced element isolation insulating films formed on said first impurity diffused regions of the second conductive type having active regions formed therebetween;

a plurality of MOS transistors formed in a matrix of columns extending in the first direction and rows extending in a second direction substantially perpendicular to said first direction, each MOS transistor including a gate formed on a part of said active region disposed between adjacent two of said element isolation films having a gate insulating film interposed therebetween, a source and drain formed in respectively two adjacent first impurity diffused regions, on which said two adjacent element isolation insulating films are formed, so that drains of adjacent transistors of a row are connected together and sources of adjacent transistors are connected together to form first and second alternating bit lines, respectively, and a channel region formed in a portion of said semiconductor substrate between the source and the drain;

a plurality of word lines, each connected electrically to said gates of said MOS transistors aligned along one of the rows and extending in said second direction; and, a second impurity diffused region of said first conductivity type formed between two adjacent channel regions of the transistors in each of the columns and having a higher impurity concentration than the impurity concentration of said semiconductor substrate for suppressing parasitic channel formation between adjacent transistor of a column.

2. A MOS semiconductor memory device according to claim 1, wherein each of said first and second alternating bit lines are connected to first and second series selective transistors, said first series selective transistors being connected to an input of a sense amplifier, said second series selective transistor being connected to a common potential.

3. A MOS semiconductor memory according to claim 1, wherein the threshold voltage of certain of said MOS transistors is increased with respect to the threshold of the remaining MOS transistors.

4. A MOS semiconductor memory according to claim 3, wherein said MOS transistors are of an enhancement type, and said certain MOS transistors have a threshold voltage greater than a voltage potential applied to said word line.

* * * * *